(12) United States Patent
Denier et al.

(10) Patent No.: US 7,795,780 B2
(45) Date of Patent: Sep. 14, 2010

(54) PHASE-LOCKED LOOP AND METHOD FOR OPERATING AN ELECTROMECHANICAL SYSTEM

(75) Inventors: Urs Denier, Jona (CH); Mark Niederberger, Einsiedeln (CH)

(73) Assignee: Austriamicrosystems AG, Unterpremstatten (AT)

( * ) Notice: Subject to any disclaimer, the term of this patent is extended or adjusted under 35 U.S.C. 154(b) by 264 days.

(21) Appl. No.: 12/080,857

(22) Filed: Apr. 7, 2008

(65) Prior Publication Data

US 2008/0266004 A1     Oct. 30, 2008

(30) Foreign Application Priority Data

Apr. 5, 2007    (DE) .................. 10 2007 016 642

(51) Int. Cl.
  *H01L 41/113*   (2006.01)
(52) U.S. Cl. .............. 310/318; 310/316.01; 310/316.02
(58) Field of Classification Search ............ 310/316.01, 310/316.02, 318
  See application file for complete search history.

(56) References Cited

U.S. PATENT DOCUMENTS

| | | | |
|---|---|---|---|
| 4,066,969 A * | 1/1978 | Pearce et al. ............... | 367/125 |
| 4,808,948 A | 2/1989 | Patel et al. | |
| 5,579,184 A * | 11/1996 | Nakanishi et al. ............. | 360/51 |
| 5,675,296 A * | 10/1997 | Tomikawa ................... | 331/158 |
| 6,331,748 B1 | 12/2001 | Hong | |
| 6,400,096 B1 * | 6/2002 | Wells et al. .................. | 315/224 |
| 6,569,109 B2 | 5/2003 | Sakurai et al. | |
| 6,639,367 B2 | 10/2003 | Wells et al. | |
| 6,841,919 B2 * | 1/2005 | Akahane et al. ........ | 310/316.01 |
| 7,183,691 B2 * | 2/2007 | Yamamoto ............. | 310/316.01 |
| 2002/0036444 A1 * | 3/2002 | Yamashiro et al. ..... | 310/316.01 |
| 2005/0206458 A1 | 9/2005 | Wu | |

* cited by examiner

*Primary Examiner*—Walter Benson
*Assistant Examiner*—Bryan P Gordon
(74) *Attorney, Agent, or Firm*—Cohen Pontani Lieberman & Pavane LLP

(57) ABSTRACT

A phase-locked loop for controlling an electromechanical component comprises a digitally controlled oscillator (10), a phase comparator (20), and a digital loop filter (30). The digitally controlled oscillator (10) has an output (11), at which an oscillator signal (SOSC) can be picked up and which can be coupled to a first terminal (51) of the electromechanical component (50). The phase comparator (20) comprises a first input (21), which is coupled to the output (11) of the digitally controlled oscillator (10), and a second input (22), which can be coupled to the first terminal (51) or to a second terminal (52) of the electromechanical component (50) for feeding a current signal (S3). The digital loop filter (30) is connected between the phase comparator (20) and the digitally controlled oscillator (10).

13 Claims, 6 Drawing Sheets

PHASE-LOCKED LOOP AND METHOD FOR OPERATING AN ELECTROMECHANICAL SYSTEM

RELATED APPLICATIONS

This application claims the priority of German patent application no. 10 2007 016 642.9 filed Apr. 5, 2007, the entire content of which is hereby incorporated by reference.

FIELD OF THE INVENTION

The present invention relates to a phase-locked loop for controlling an electromechanical component, to an electromechanical system, and to a method for operating an electromechanical system.

BACKGROUND OF THE INVENTION

The electromechanical system has an electromechanical component, which can comprise, for example, a piezoelectric component. Such systems are used, for example, for generating small displacements. Here, normally a piezo-ceramic is used, which creates a desired displacement after a voltage is applied. Document U.S. Pat. No. 6,331,748 B1 describes a control circuit of a piezo-ceramic transformer used to operate a lamp.

In document U.S. Pat. No. 6,639,367 B2, a control circuit for a piezo transformer with a voltage-regulated oscillator also for powering a lamp is shown.

SUMMARY OF THE INVENTION

In one embodiment, a phase-locked loop comprises a digitally controlled oscillator, a phase comparator, and a digital loop filter for controlling an electromechanical component. The digitally controlled oscillator has an output. The phase comparator comprises a first and a second input. The first input of the phase comparator is connected to the output of the digitally controlled oscillator. The digital loop filter is coupled at one input to an output of the phase comparator and at one output to an input of the digitally controlled oscillator. A first terminal of the electromechanical component can be coupled to the output of the digitally controlled oscillator. The second input of the phase comparator can be coupled to the first terminal or to a second terminal of the electromechanical component.

The digitally controlled oscillator generates an oscillator signal at the output of the digitally controlled oscillator. The oscillator signal or a signal derived from this signal is fed to the first terminal of the electromechanical component. The oscillator signal is also fed to the first input of the phase comparator. A current signal is fed to the second input of the phase comparator.

Advantageously, in the resonance case of the phase detector, a phase signal is prepared with a value that controls the digitally controlled oscillator, after filtering by the digital loop filter, in such a way that the frequency of the oscillator signal is maintained. Advantageously, in the non-resonance case, however, the phase detector prepares the phase signal with a different value that controls the digitally controlled oscillator, after filtering by the loop filter, in such a way that the frequency of the oscillator signal approaches a resonant frequency.

The electrical properties of an electromechanical component can be temperature dependent. Advantageously, the phase-locked loop tracks the frequency of the oscillator signal, so that the resonant frequency is also reached for a change in temperature.

Preferably, the current signal depends on a value of the current flowing through the electromechanical component.

In one embodiment, the phase-locked loop comprises a comparator, which is connected to the second input of the phase comparator. In one embodiment, the comparator can couple the second terminal of the electromechanical component to the second input of the phase comparator. Alternatively, a coupling of the first terminal of the electromechanical component to the second input of the phase comparator can comprise the comparator. Thus, the phase comparator can be coupled at a second input via the comparator to the first terminal or to a second terminal of the electromechanical component. The coupling is used for feeding a digital current signal to the second input of the phase comparator.

In one embodiment, the comparator is used to convert a signal that can be picked up at the first or the second terminal of the electromechanical component or a signal derived from this signal into the digital current signal. In one embodiment, the oscillator signal is formed as a digital signal. Advantageously, a digital signal can be fed to the phase detector both at a first and also at a second input. In one embodiment, the comparator compares the signal that can be picked up at the first or the second terminal of the electromechanical component or the signal derived from this signal with a comparator threshold. The comparator threshold can have a value from an interval between −1.5 V and +1.5 V. Preferably, the comparator threshold can have a value from an interval between −50 mV and +50 mV. The comparator threshold can equal 0 V.

In one refinement, the comparator is formed as a Schmitt trigger. The Schmitt trigger can have a value from an interval between 0.7 V and 1.7 V as the comparator threshold. A hysteresis region, which has the comparator threshold as the center point, can have a width of 0.6 V. Thus, the width of the hysteresis region is the difference between the turn-on level and the turn-off level.

In one embodiment, the phase comparator is designed to determine a phase difference between a first signal, which is applied to the first input of the phase comparator, and the current signal, which is fed to the second input of the phase comparator, and to output a digital phase signal at the output of the phase comparator as a function of the phase difference. Thus, preferably, the first signal corresponds to the oscillator signal and thus a voltage, which is fed to the electromechanical component, and the current signal corresponds to a current, which flows through the electromechanical component. The first signal, the oscillator signal, the current signal, and the phase signal are preferably digital signals. They are preferably constructed as discrete-value and continuous-time signals.

In one embodiment, the phase-locked loop has a first register in which a programming value for the frequency of the oscillator signal is stored. The first register can be coupled to another input of the digitally controlled oscillator. In one embodiment, at the beginning of an operating phase of the phase-locked loop, the first register is read out and the digitally controlled oscillator is adjusted in such a way that the oscillator signal has a frequency corresponding to the programming value. Advantageously, the first register can specify the starting frequency from which the phase-locked loop is to be tuned to settle on a resonant frequency. Because an electromechanical system with an electromechanical component can have several resonant frequencies, the resonance provided for operation can be set by means of the provided programming value stored in the first register.

In one refinement, the phase-locked loop has a second register in which, during an operating phase, a value of the frequency of the oscillator signal can be stored. The second register can be coupled to an additional input of the digitally controlled oscillator. In one embodiment, the value of the frequency of each oscillator signal is stored in the second register, which is applied to the output of the oscillator signal shortly before the end of an operating phase. In one embodiment, at the beginning of a following operating phase, the value of the second register is read out and the oscillator signal is prepared by the digitally controlled oscillator with a frequency that corresponds to the value that is stored in the second register and that is thus set as another programming value. At subsequent points in time of the operating phase, the frequency of the oscillator is prepared as a function of the phase signal. Advantageously, in the second operating phase, the phase-locked loop is tuned very quickly to a resonant frequency, since the resonant frequency that was stored at the end of the first operating phase is used as a starting value for the frequency of the oscillator signal.

In one embodiment, the phase-locked loop comprises a control device, which is connected to the digitally controlled oscillator and to the phase detector. The control device is designed to give different frequency values of the oscillator signal during a measurement phase. In a time sequence, the oscillator signal thus features another frequency value. The control device is designed to pick up the phase signal and to determine a characteristic frequency by means of an evaluation of the phase signal. Such a characteristic frequency can be a resonant frequency. In one embodiment, the control device determines several characteristic frequencies that correspond to several resonance frequencies. In one refinement, the control device prepares a signal on the output side, which represents the number of determined characteristic frequencies and thus the number of detectable resonant frequencies.

According to an embodiment, an electromechanical system comprises the phase-locked loop and an arrangement, which comprises the electromechanical component. The arrangement features a frequency-dependent impedance. The frequency-dependent impedance comprises at least one resonant frequency.

The electromechanical component can comprise a filter. Preferably, the electromechanical component comprises an actuator. In one refinement, the actuator can be provided as the frequency-determining component that gives the frequency of the oscillator signal.

The actuator can be realized as a piezoelectric component. The actuator can be realized as a piezo-ceramic.

Preferably, the actuator is realized as an oscillating crystal. An oscillating crystal can have a series resonance, at which the impedance of the oscillating crystal assumes a low value and the imaginary part of the impedance of the oscillating crystal is approximately 0. Likewise, the oscillating crystal can have a parallel resonance, at which the impedance of the oscillating crystal assumes a high value. The resonant frequencies of oscillating crystals can comprise, for example, values between 1 MHz and 200 MHz. In one embodiment, the oscillating crystal can be used as the frequency-determining component.

In one refinement, the electromechanical system comprises an inductive component, which couples the first terminal of the actuator to the output of the digitally controlled oscillator. Advantageously, a resonant frequency of a series circuit comprising the inductive component and the electromechanical component can be set by means of the inductive component. Advantageously, a resonant frequency can be set, which is significantly lower than a resonant frequency of the actuator. The displacement of the resonant frequency can equal a few kHz. A resonant frequency that can be adjusted by means of the inductive component can have a value, for example, from a range comprising the frequencies between 100 kHz and 250 kHz. Advantageously, the actuator can be operated outside of its resonant frequency. Advantageously, an additional resonant frequency, which results from the inductive component and a parallel capacitance of the actuator, is generated by means of the inductive component. An amplitude of a voltage between the first and the second terminal of the actuator can be high based on the series resonance with the inductive component. Advantageously, the amplitude of the voltage between the two terminals of the actuator depend on whether, for example, the actuator experiences additional attenuation. The frequency of the oscillator signal is thus given by the inductive component and the electromechanical component.

In one refinement, the actuator is connected to a reference voltage terminal via a resistive component. A circuit node between the actuator and the resistive component can be coupled via the comparator to the second input of the phase detector.

The inductive component can be realized as a coil. The resistive component can be constructed as a resistor.

In the case of a series resonance of the inductive component and the actuator, the impedance of the series oscillating circuit comprising the inductive component and the electromechanical component has an imaginary part of approximately 0. The real part of the impedance can represent ohmic losses, which can be determined by the resistance of the coil. In this case, the first signal and the current signal, which are applied to the first and the second inputs of the phase detector, have no phase difference. Therefore, the phase detector prepares a phase signal with the value 0. The digitally controlled oscillator holds the frequency of its oscillator signal. If the frequency of the oscillator signal is greater or smaller than the resonant frequency of the series oscillating circuit, then the first signal and the current signal are not in phase. In this case, the phase detector prepares the phase signal with a value that controls the digitally controlled oscillator in such a way that the frequency of the oscillator signal approaches the resonant frequency of the series oscillating circuit.

In one embodiment, the phase-locked loop comprising the digitally controlled oscillator, the phase comparator, and the digital loop filter is constructed on a semiconductor body. In an alternative embodiment, the semiconductor body also comprises the comparator. In one refinement, the semiconductor body also has the first and the second registers, as well as the control device. The phase-locked loop can be realized using bipolar integration technology. Preferably, it can be manufactured by means of complementary metal-oxide-semiconductor integration technology or CMOS integration technology.

In contrast to a phase-locked loop, which is used for mobile-radio communications and which prepares frequencies between several hundred megahertz and several gigahertz, a phase-locked loop according to the invention can be designed differently and can prepare frequencies in the range from 100 kHz and a few 100 kHz.

In one embodiment, a method for operating an electromechanical system comprising a phase-locked loop and an arrangement that can oscillate includes the following steps: a digitally controlled oscillator is set with a programming value. The phase-locked loop comprises the digitally controlled oscillator. The digitally controlled oscillator outputs an oscillator signal. The arrangement that can oscillate is excited by means of the oscillator signal. A phase comparison of the oscillator signal with a current signal, which is dependent on a current flowing through the arrangement, is performed. The oscillator signal is tracked as a function of the phase comparison.

Advantageously, a frequency of the oscillator signal is tuned to a resonant frequency of the arrangement that can oscillate.

In one embodiment, a signal dependent on a current flowing through the oscillatory arrangement is compared with a comparator threshold and prepares a digital current signal as a function of the comparison result. The comparison is performed by a comparator. The comparator can be used for setting a current direction of the current flowing through the oscillatory arrangement. The subsequent phase comparison is performed between a phase of the oscillator signal and a phase of the digital current signal.

BRIEF DESCRIPTION OF THE DRAWINGS

The invention is explained in more detail below using several embodiments with reference to figures. Components with identical functions and effects carry the same reference symbols. As far as circuit parts or components correspond in function, the description will not be repeated in each of the following figures.

DETAILED DESCRIPTION OF THE DRAWINGS

Figure 1A:
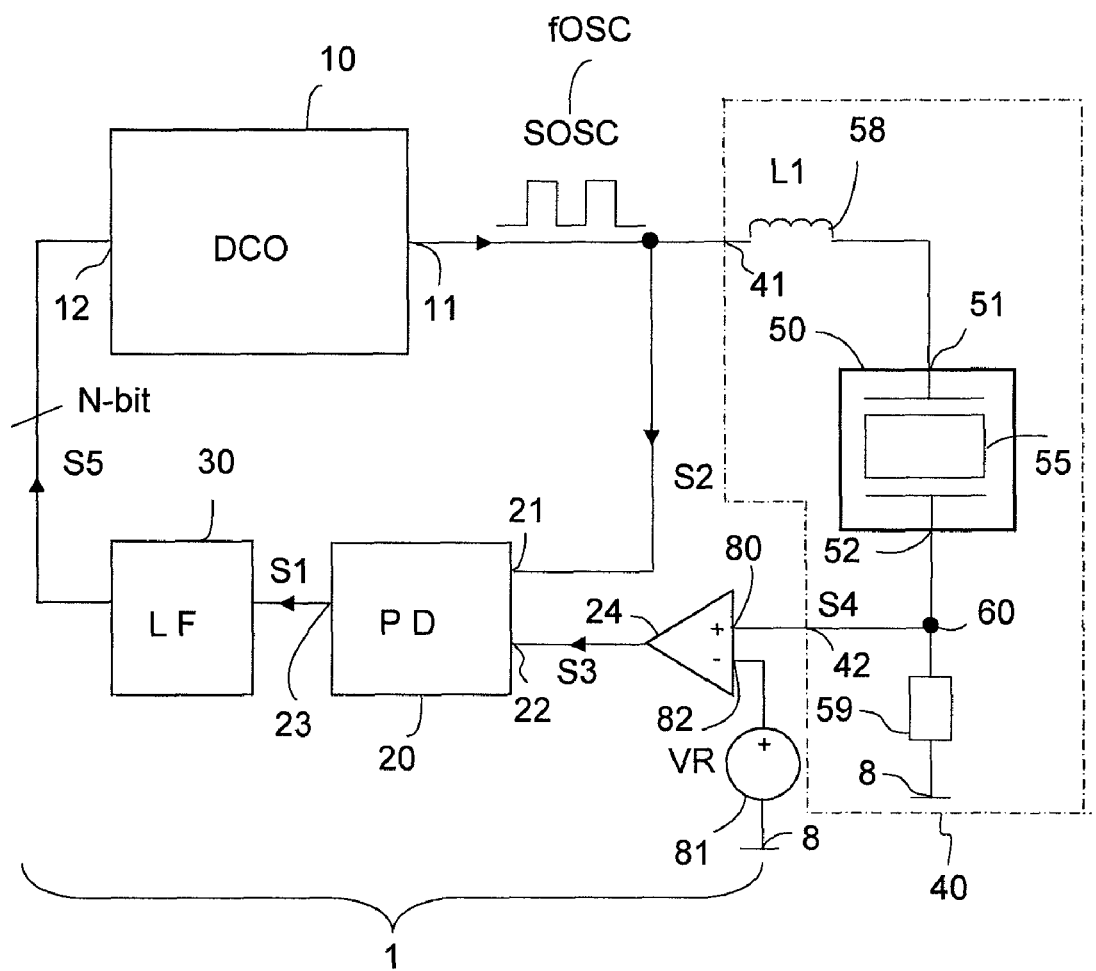
FIGS. 1A and 1B show example embodiments of an electromechanical system according to the invention.

FIG. 1A shows an example embodiment of an electromechanical system according to the invention. The electromechanical system comprises a phase-locked loop 1 and an arrangement 40 which has an electromechanical component 50. The phase-locked loop 1 has a digitally controlled oscillator 10, a phase comparator 20, and a digital loop filter 30. The digitally controlled oscillator 10 comprises an output 11 and an input 12. The phase detector 20 has a first input 21, a second input 22, and an output 23. The first input 21 of the phase detector 20 is connected directly to the output 11 of the digitally controlled oscillator 10. The output 23 of the phase detector 20 is connected to an input of the digital loop filter 30. One output of the digital loop filter 30 is coupled to the input 12 of the digitally controlled oscillator 10. The coupling is realized by n parallel lines. The phase-locked loop 1 further comprises a comparator 24, which is connected to the second input 22 of the phase detector 20.

The arrangement 40 comprises the electromechanical component 50, an inductive component 58, and a resistive component 59. The inductive component 58 and electromechanical component 50 are connected in series. A first terminal 51 of the electromechanical component 50 is connected via the inductive component 58 to a first terminal 41 of the arrangement 40. The first terminal 41 of the arrangement 40 is connected to the output 11 of the digitally controlled oscillator 10. A second terminal 52 of the electromechanical component 50 is coupled via the resistive component 59 to a reference voltage terminal 8. A circuit node 60 is arranged between the second terminal 52 of the electromechanical component 50 and the resistive component 59 and connected to a second terminal 42 of the arrangement 40. The second terminal 42 of the arrangement 40 is coupled via the comparator 24 to the second input 22 of the phase detector 20. In this way, the first terminal 51 of the electromechanical component 50 is coupled to the output 11 of the digitally controlled oscillator 10 and the second terminal 52 of the electromechanical component 50 is coupled to the second input 22 of the phase detector 20. The electromechanical component 50 has a piezoelectric component 55. The piezoelectric component 55 is constructed as an oscillating crystal.

The digitally controlled oscillator 10 provides at the output 11 of the digitally controlled oscillator 10 an oscillator signal SOSC with a frequency fOSC. The oscillator signal SOSC is fed to the first input 21 of the phase detector 20 and thus forms the first signal S2. The oscillator signal SOSC is also fed to the arrangement 40 and generates, at a series circuit comprising the inductive component 58, the electromechanical component 50, and the resistive component 59, a voltage drop between the circuit node 60 and the reference voltage terminal 8. A feedback signal S4 that can be picked up at the circuit node 60 and thus at the second terminal 52 of the electromechanical component 50 is fed via the second terminal 42 of the arrangement 40 and via the comparator 24 as a current signal S3 to the second input 22 of the phase detector 20. The comparator 24 thus converts the feedback signal S4 into a digital current signal S3. The resistive component 59 is provided for in-phase current measurement of the current flowing through the electromechanical component 50. The phase detector 20 provides at the output 23 of the phase detector 20 a phase signal S1, which is fed to the loop filter 30. The digital loop filter 30 filters the phase signal S1 and provides a filtered signal S5 to the digitally controlled oscillator 10 at the input 12 of the digitally controlled oscillator 10. As a function of the filtered signal S5 and thus of the phase signal S1, the digitally controlled oscillator 10 generates the oscillator signal SOSC with the frequency fOSC.

Advantageously, an oscillator signal SOSC with a frequency fOSC, which corresponds to a resonant frequency of the arrangement 40, is prepared by means of the arrangement 40 and the phase-locked loop 1. Advantageously, a voltage U, which has a value several times the voltage value compared with a voltage value of the oscillator signal SOSC, is achieved on the electromechanical component 50 by means of the inductor 58.

In an alternative, not-shown embodiment, instead of the resistive component 59 there is a current measurement element or a current measurement circuit for in-phase current measurement of the current flowing through the electromechanical component 50.

In an alternative, not-shown embodiment, the inductive component 58 is left out and replaced with a conductive connection.

Figure 1B:
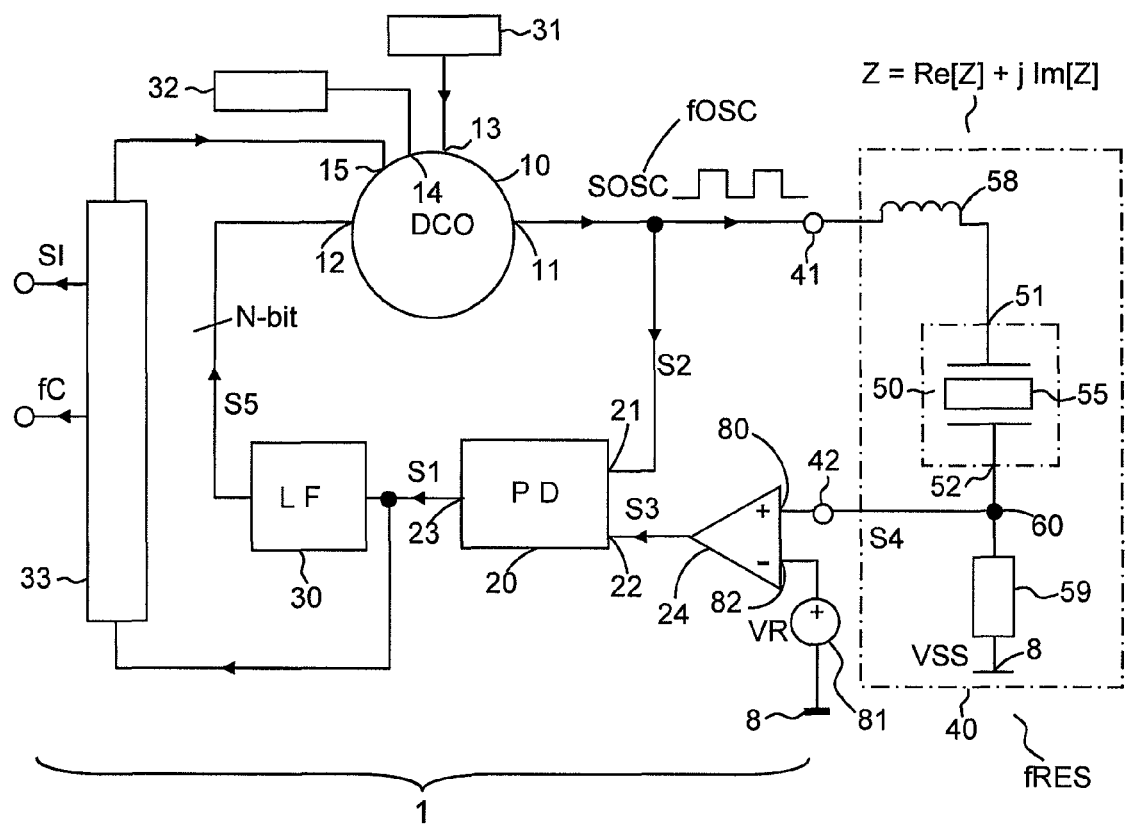

FIG. 1B shows an example embodiment of an electromechanical system according to the invention, which is an improvement of the embodiment shown in FIG. 1A. The phase-locked loop 1 also comprises, according to FIG. 1B, a first register 31, which is connected to another input 13 of the digitally controlled oscillator 10. The phase-locked loop 1 further comprises a second register 32, which is attached to an additional input 14 of the digitally controlled oscillator 10. The phase-locked loop 1 also has a control device 33, which is connected on the input side to the output 23 of the phase detector 20 and on the output side to another additional input 15 of the digitally controlled oscillator 10.

At the beginning of a first operating phase, a programming value, which represents a frequency, is read from the first register 31 and fed to the digitally controlled oscillator 10. The digitally controlled oscillator 10 thus starts with an oscillator signal SOSC, whose frequency fOSC corresponds to the value of the first register 31. During the first operating phase, according to the arrangement 40 and the operation of the phase-locked loop 1, an oscillator signal SOSC is set with a frequency fOSC, which corresponds to a resonant frequency fRES of the arrangement 40.

During the first operating phase, the value of the frequency fOSC is stored in the second register 32 as another programming value. After the end of the first operating phase, the phase-locked loop 1 is turned off. In the turned-off phase, the digitally controlled oscillator 10 outputs no oscillator signal SOSC. At the beginning of the second operating phase, the value stored in the second register 32 is read out and fed to the digitally controlled oscillator 10, so that at the beginning of the second operating phase, the digitally controlled oscillator 10 starts with an oscillator signal SOSC, which has, as the frequency fOSC, the value of the second register 32. Also, in the second operating phase, a new frequency value fOSC of the oscillator signal SOSC is determined and stored in the second register 32. Other such operating phases and turned-off phases follow in an alternating fashion.

In a measurement phase, the control device 33 sets the phase-locked loop 1 in such a way that the digitally controlled oscillator 10 provides an oscillator signal SOSC with different frequencies fOSC. The oscillator signal SOSC runs through the different frequencies one after the other at adjustable time intervals. The oscillator signal SOSC has a first frequency value f1 in a first time section. There follows at least one second time section. In the second time section, the oscillator signal has a second frequency value f2. The arrangement 40 is supplied with the oscillator signal SOSC and thus determines the first signal S2 and the current signal S3. The phase comparator 20 provides the phase signal S1 at the end of the first time interval with a first value and at the end of the second time interval with a second value. The first value and the second value of the phase signal S1 are fed to the control device 33. The control device 33 prepares a value of a characteristic frequency fC on the output side as a function of the first and the second values of the phase signal S1 and also the first and the second frequency values f1, f2. In this way, it can be determined, for example, whether for the first frequency value f1 or for the second frequency value f2 the phase difference is smaller and thus the imaginary part of the impedance of the series circuit comprising the inductive component 58 and the electromechanical component 50 is smaller.

Advantageously, the digitally controlled oscillator 10 starts with a frequency fOSC that can be set by means of a programming value. In this way, the digitally controlled oscillator 10 is tuned very quickly to the resonant frequency fRES. If the arrangement 40 has several resonant frequencies, then advantageously the resonant frequency provided for the operation of the electromechanical system can be set by means of the programming value stored in the first register 31. In this way, the electromechanical system can be prevented from operating at an undesired resonant frequency.

Advantageously, during an operating phase, a value of the resonant frequency fRES is determined by means of the phase-locked loop 1 and stored in the second register 32. A second operating phase thus starts from the original value of the resonant frequency fRES that was determined in the first operating phase. In this way, the adjustment of the phase-locked loop 1 or the digitally controlled oscillator 10 can be performed in a very short time. The electromechanical component 50 is here operated at a defined frequency and at a defined voltage.

In one embodiment, a first number of frequency values is provided by the control device 33, so that the oscillator signal SOSC passes through different connecting points in a wide frequency range between a lower frequency value fU and an upper frequency value fO. The frequency range can comprise, for example, frequency values from 100 kHz up to 200 kHz. The control device can determine how many characteristic frequencies fC, that is, how many resonant frequencies fRES, are detected within the frequency range. The control device 33 can determine from the number of determined resonant frequencies fRES whether or not mechanical work is performed by the electromechanical component 50. If mechanical work is performed, then the electromechanical component 50 is damped in such a way that the number of resonant frequencies fRES that can be determined by the control device 33 is smaller than the number of resonant frequencies fRES that can be determined in the case without mechanical work. For this purpose, the control device compares the number of determined resonant frequencies fRES with a default value. In this way, the electromechanical system can determine whether or not an additional damping of the electromechanical component 50 is present and can prepare a signal SI, which represents this information.

Figure 2A:
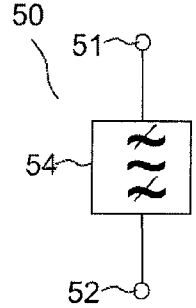
FIGS. 2A to 2C show additional example embodiments of an electromechanical component.

FIG. 2A shows another example embodiment of an electromechanical component 50, which comprises a filter 54.

Figure 2B:
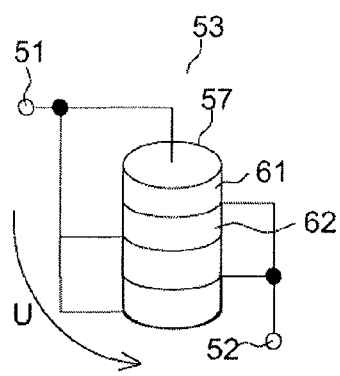

FIG. 2B shows another example embodiment of an electromechanical component 50, which comprises an actuator 53 that is constructed as a piezoelectric component and indeed as a piezo-ceramic 57. The piezo-ceramic 57 has several stacked piezo layers 61, 62.

Figure 2C:
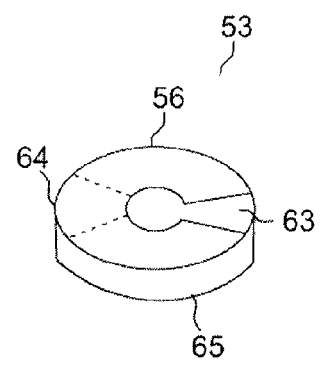

FIG. 2C shows another example embodiment of an electromechanical component 50, which comprises an actuator 53, which is constructed as a piezoelectric component and indeed as an oscillating crystal 56. The oscillating crystal 56 comprises two electrodes 63, 64, which are arranged on the two main faces of a quartz disk 65.

A deflection of the piezo-ceramic 57 and the oscillating crystal 56 is dependent on an applied voltage U.

In an alternative, not-shown embodiment, the electromechanical component 50 comprises a first and a second coil as well as a mechanical oscillator. The two coils are connected to the mechanical oscillator. The mechanical oscillator is deflected by a force of a magnetic field of the first coil. The deflection induces a voltage in the second coil which is fed to the second input 22 of the phase comparator 20. The electromechanical component 50 has at least one resonant frequency fRES that can be detected in this way.

Figure 3:
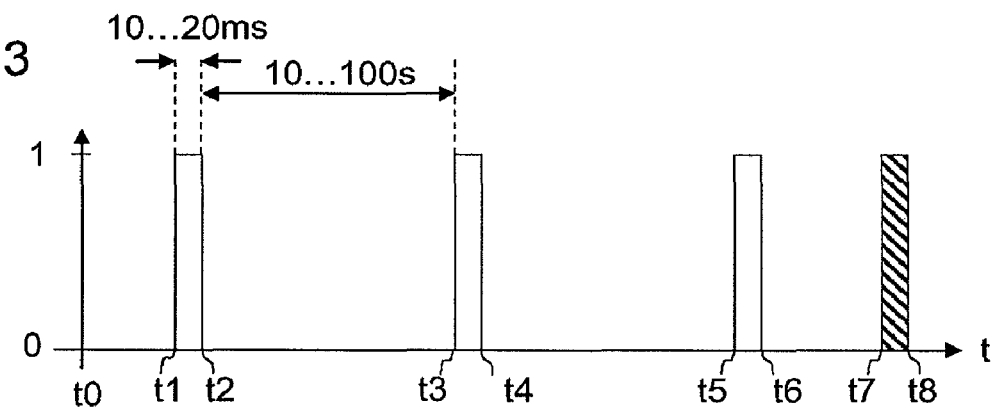
FIG. 3 shows an example sequence of operating and measurement phases.

FIG. 3 shows an embodiment of a mode of the electromechanical system with an example sequence of operating and measurement phases. In FIG. 3 it is shown in which time frames the phase-locked loop 1 is located in an active operating state and thus the digitally controlled oscillator 10 prepares the oscillator signal SOSC. In the time frame between a first time point t0 and a second time point t1, the digitally controlled oscillator 10 is turned off. In the time frame between the second time point t1 and a third time point t2, the phase-locked loop 1 is in a first operating phase. In the time frames between the third time point t2 and a fourth time point t3, as well as between a fifth time point t4 and a sixth time point t5 and also between a seventh time point t6 and an eighth time point t7, the phase-locked loop 1 is in an inactive operating state. The time frame of an inactive operating state can equal, for example, 10 to 100 s. In the time frame between the fourth time point t3 and the fifth time point t4, the phase-locked loop 1 and thus the digitally controlled oscillator 10 are in a second operating state and in the time frame between the sixth time point t5 and the sixth time point t6 in another active operating state. The time frame of an active operating state can equal, for example, 10 to 20 ms. In the time frame between the eighth time point t7 and a ninth time point t8, the electromechanical system is in a measurement phase.

Figure 4A:
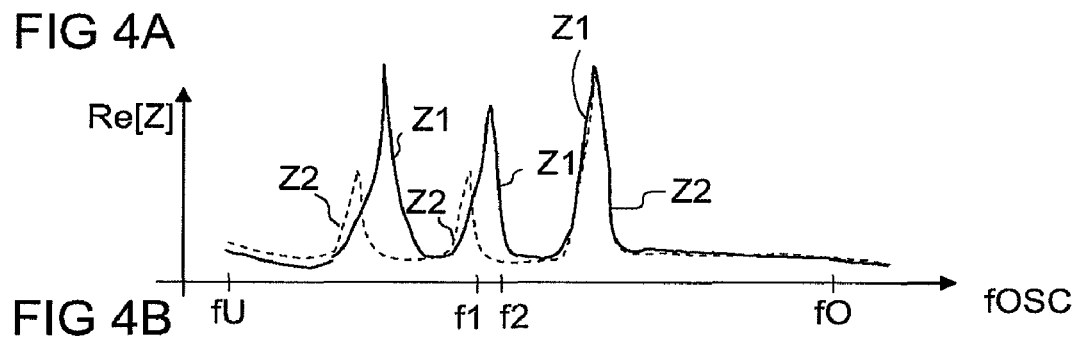
FIGS. 4A and 4B show an example impedance spectrum of an electromechanical component.
Figure 4B:
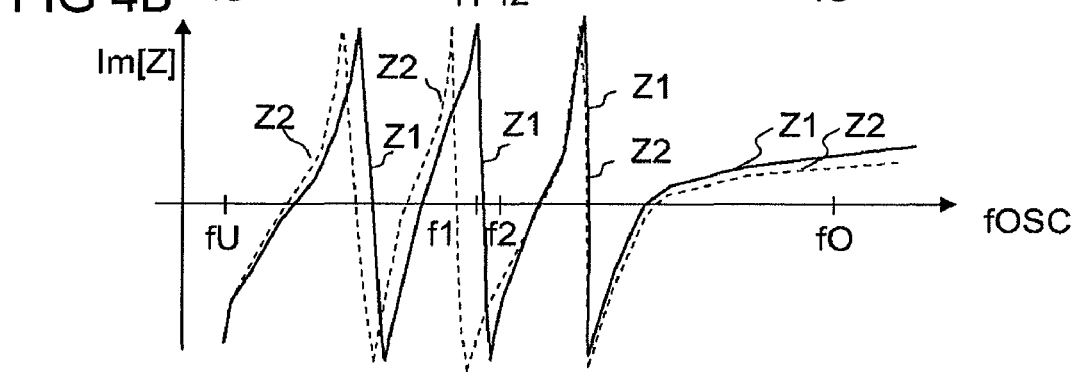

FIGS. 4A and 4B show an example impedance spectrum of an electromechanical component 50, which comprises an actuator 53 and is constructed as a piezoelectric component 55, for example, an oscillating crystal 56. The electromechanical component 50 is connected as shown in FIGS. 1A and 1B. Thus, the oscillatory arrangement 40 has the electromechanical component 50 as well as the inductive component 58 and the resistive component 59. FIG. 4A is a plot of the real part and FIG. 4B of the imaginary part of the complex impedance Z versus the frequency fOSC.

In a first state, the electromechanical component 50 has an impedance Z1. In a second state, the electromechanical component has a higher impedance Z2. The difference is caused by additional attenuation by the electromechanical component.

In FIG. 4A, the real part of the impedance Z1 is plotted without additional attenuation and the real part of the impedance Z2 is plotted with additional attenuation. Both curves show three maximum values. Here, in two cases, the maximum values of the real part of the impedance Z2 with additional attenuation have a lower value than the real part of the impedance Z1 without additional attenuation. In addition, in two cases, the maximum values of the real part of the impedance Z2 with additional attenuation is shifted to lower frequency values in comparison with the real part of the impedance Z1 without additional attenuation.

In FIG. 4B, the imaginary part of the impedance Z1 without additional attenuation and the imaginary part of the impedance Z2 with additional attenuation are shown. The imaginary part of the impedance Z1 without additional attenuation has seven frequencies at which the imaginary part is 0, and thus the arrangement 40 exclusively exhibits a real part of the impedance Z1. In this case, there is no phase difference between the two signals S2, S3, which are fed to the phase detector 20. The imaginary part of the impedance Z2 with additional attenuation also has seven frequencies, at which the imaginary part assumes the value 0 and thus the two signals S2, S3, which are fed to the phase detector 20, show no phase difference. In four of the seven cases, the frequency values, at which the imaginary part of the impedance Z2 with additional attenuation has the value 0, are shifted to lower frequency values in comparison with the impedance Z1 without additional attenuation.

Advantageously, a starting value for the frequency fOSC, at which the electromechanical system oscillates at the seven zero crossings of the imaginary part of the impedance Z1 or Z2, can be set and thus defined in advance by means of the programming value stored in the first register 31 of the electromechanical system. The frequency range shown in FIGS. 4A and 4B can extend, for example, from a lower frequency fU, which equals 100 kHz, up to an upper frequency fO, which equals 200 kHz.

In alternative embodiments of the arrangement 40, there are only one or two maximum values. In other embodiments of the electromechanical system, there are more than three maximum values.

Figure 5A:
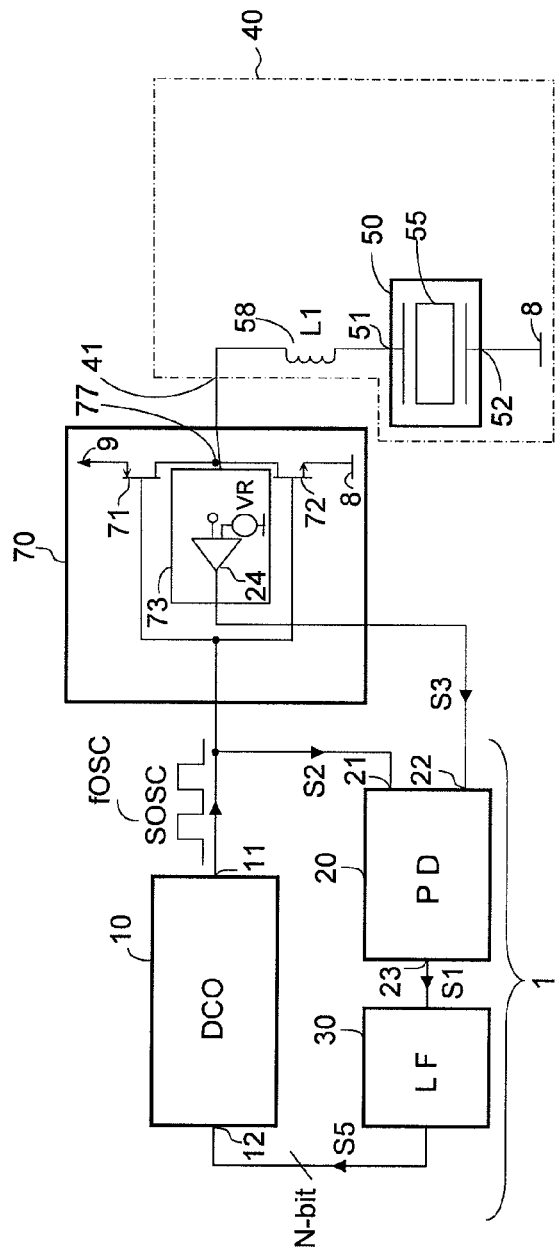
FIGS. 5A and 5B show additional example embodiments of an electromechanical system according to the invention.

FIG. 5A shows another example embodiment of an electromechanical system according to the invention. The phase-locked loop 1 is constructed according to the phase-locked loop according to FIG. 1A. The arrangement 40 comprises the inductive component 58 and the electromechanical component 50, which are connected in series. The series circuit is connected between the first terminal 41 of the arrangement 40 and the reference voltage terminal 8. A driver 70 is connected between the digitally controlled oscillator 10 and the arrangement 40. The driver 70 connects the output 11 of the oscillator 10 to the first terminal 41 of the arrangement 40. The driver 70 is realized as an inverter and comprises a first and a second driver transistor 71, 72, which are connected in series between a power supply voltage terminal 9 and the reference voltage terminal 8. The two driver transistors 71, 72 are realized as metal-oxide semiconductor field-effect transistors or MOSFETs. The control terminals of the two driver transistors 71, 72 are connected to the output 11 of the oscillator 10. A first pick-up 77 between the two driver transistors 71, 72 is connected to the first terminal 41 of the arrangement 40. The driver 70 comprises a current measurement and comparator circuit 73, which couples the first terminal 41 of the arrangement 40 to the second input 22 of the phase comparator 20. The current measurement and comparator circuit 73 comprises the comparator 24, which is connected to the output of the current measurement and comparator circuit 73. The comparator 24 is connected in a coupling between the first terminal 51 of the electromechanical component 50 and the second input 22 of the phase comparator 20.

The current measurement and comparator circuit 73 provides the current signal S3 as a digital signal, which is fed to the second input 22 of the phase comparator 20. The current signal S3 is formed as a function of a voltage drop on the first driver transistor 71 and/or a voltage drop on the second driver transistor 72. The voltage drop depends on the on-resistance of each driver transistor and the current through the arrangement 40.

Advantageously, the driver 70 is used as the output stage of the oscillator 10 and thus decouples the oscillator 10 from the electromechanical component 50. The resistive component 59 is advantageously left out and replaced with a conductive connection, so that ohmic losses are reduced relative to the embodiment shown in FIG. 1. The current flowing through the electromechanical component 50 is advantageously measured by means of the current measurement and comparator circuit 73.

In an alternative embodiment, the phase-locked loop 1 is realized as shown in FIG. 1B.

Alternatively, the two driver transistors 71, 72 can be constructed as bipolar transistors or as junction field-effect transistors.

Figure 5B:
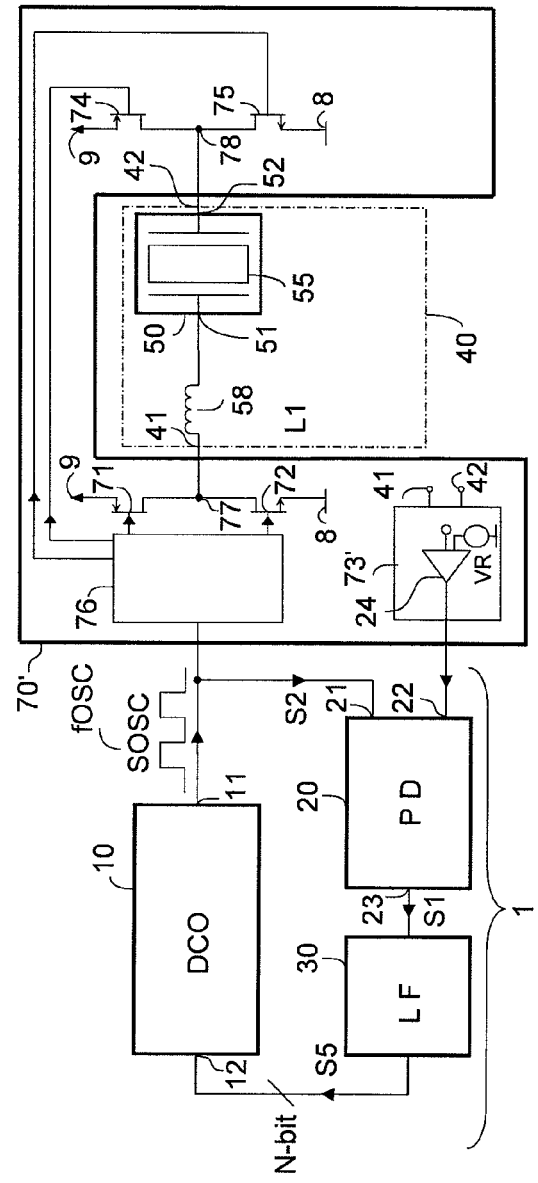

FIG. 5B shows an example embodiment of an electromechanical system according to the invention, which is a refinement of the embodiment shown in FIG. 5A. The arrangement 40 comprises the inductive component 58 and the electromechanical component 50, which are connected in series. The series circuit is connected between the first and the second terminals 41, 42 of the arrangement 40. The driver 70' is connected between the digitally controlled oscillator 10 and the arrangement 40. The driver 70' connects the output 11 of the oscillator 10 to the first and the second terminals 41, 42 of the arrangement 40. The driver 70' comprises the inverter, which has the first and the second driver transistors 71, 72. In addition, the driver 70' comprises another inverter, which has a third and a fourth driver transistor 74, 75, which are connected in series between the power supply voltage terminal 9 and the reference voltage terminal 8. The control terminals of the four driver transistors 71, 72, 74, 75 are coupled via a switch controller 76 to the output 11 of the oscillator 10. The first pick-up 77 between the first and the second driver transistors 71, 72 is connected to the first terminal 41 of the arrangement 40. Furthermore, a second pick-up 78 between the third and the fourth driver transistors 74, 75 is connected to second terminal 42 of the arrangement 40. The current measurement and comparator circuit 73' of the driver 70' is connected on the input side via not-shown connection lines to the first and the second terminal 41, 42 of the arrangement 40 and on the output side to the second input 22 of the phase comparator 20. The current measurement and comparator circuit 73' comprises the comparator 24, which is connected to the output of the current measurement and comparator circuit 73'.

The current measurement and comparator circuit 73' provides the digital current signal S3, which is fed to the second input 22 of the phase comparator 20. The current signal S3 is formed as a function of a voltage drop on the first driver transistor 71 and/or a voltage drop on the second driver transistor 72. Furthermore, the current signal S3 is formed as a function of a voltage drop on the third driver transistor 74 and/or a voltage drop on the fourth driver transistor 75. Because the active driver transistors alternate periodically, the current measurement is also switched accordingly.

Advantageously, the driver 70' provides an H-bridge for operating the arrangement 40. The current flowing through the electromechanical component 50 is measured advantageously by means of the current measurement and comparator circuit 73' in the driver 70'.

In an alternative embodiment, the phase-locked loop 1 is realized as shown in FIG. 1B.

Figure 6A:
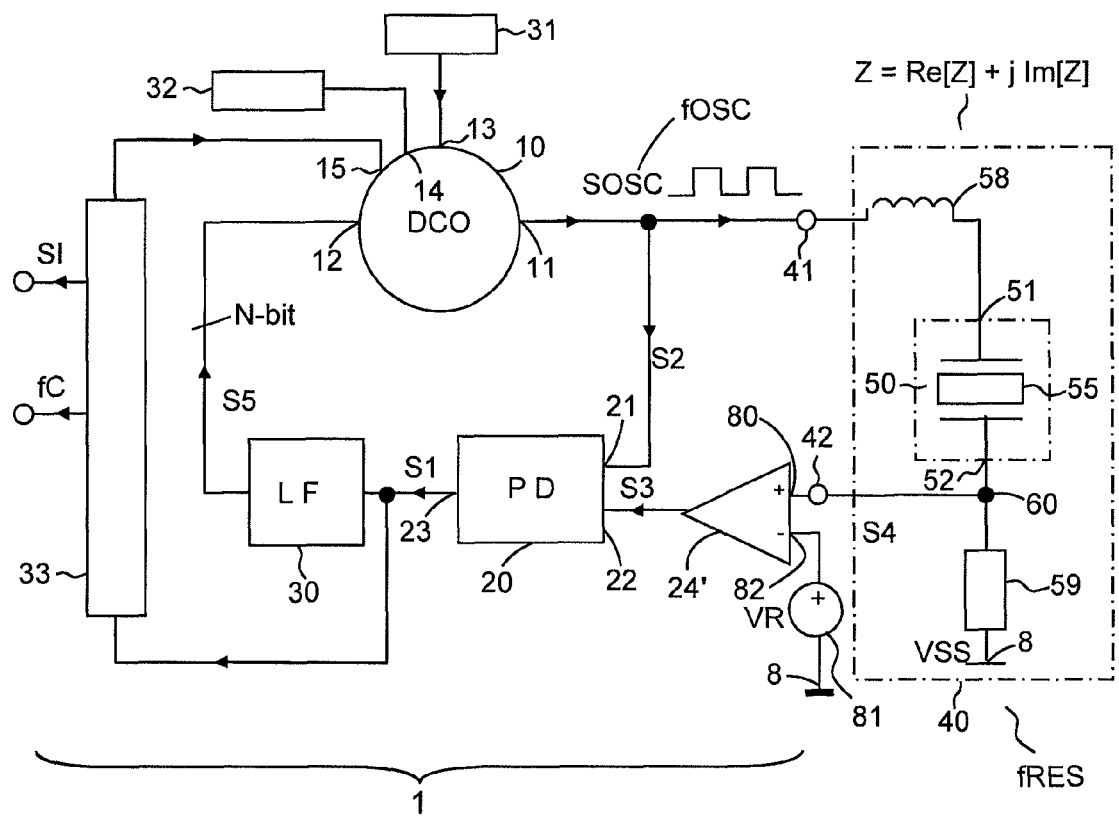
FIGS. 6A and 6B show additional example embodiments of the electromechanical system according to the invention.

FIG. 6A shows another example embodiment of the electromechanical system according to the proposed principle. The embodiment is a further development of the embodiments which are shown in FIGS. 1A and 1B. The comparator 24' comprises a first input terminal 80 which is connected to the circuit node 60 via the second terminal 42. The phase locked loop 1 further comprises a voltage source 81. A second input terminal 82 of the comparator 24' is connected to the voltage source 81. The voltage source 81 couples the second input terminal 82 to the reference potential terminal 8.

The voltage source 81 provides a comparator threshold voltage VR to the second input terminal 82. The comparator threshold voltage VR can have a value from an interval between −1.5 V and +1.5 V. The feedback signal S4 that can be picked up at the second terminal 52 of the electromechanical component 50 is provided to the first input terminal 80. The comparator 24' compares the feedback signal S4 with the comparator threshold voltage VR and generates the current signal S3 which is provided to the second input 22 of the phase comparator 20. The current signal S3 is provided as a digital signal by the comparator 24'.

The comparator 24' and the voltage source 81 can also be implemented in the phase-locked loop of FIGS. 1A and 1B as well as in the current measurement and comparator circuit 73, 73' of FIGS. 5A and 5B.

Figure 6B:
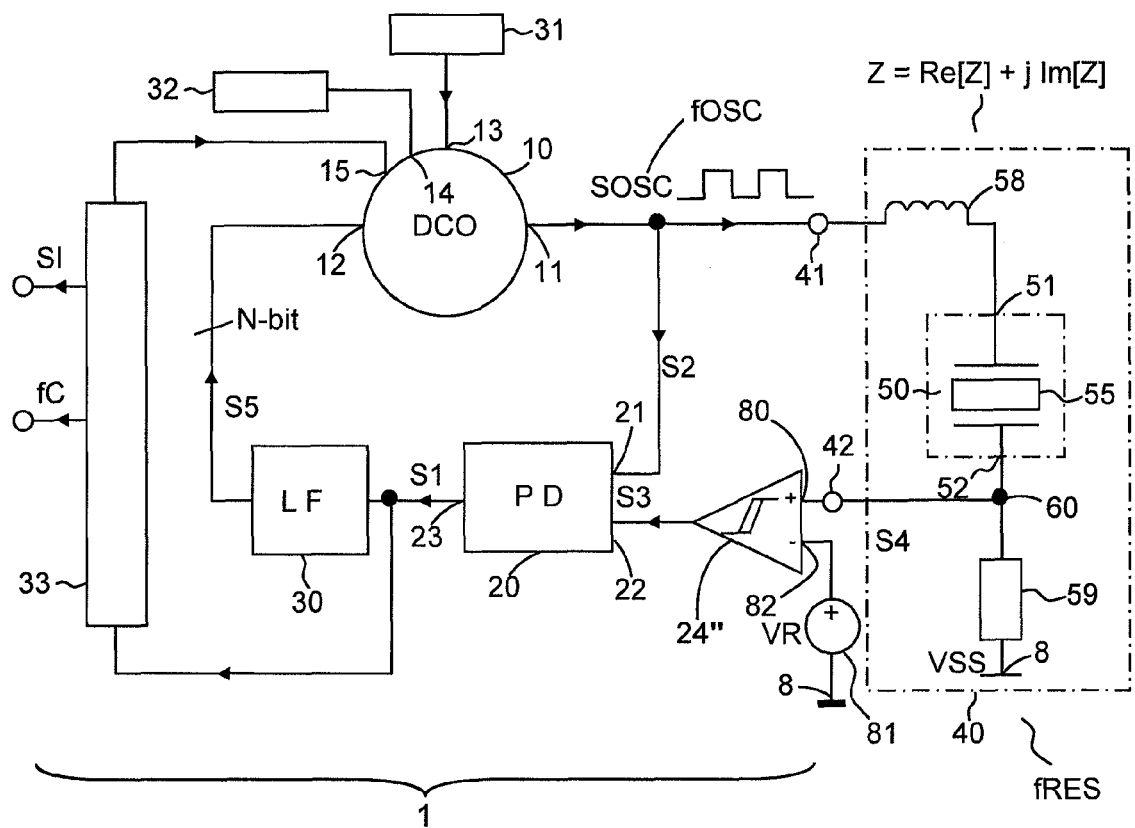

FIG. 6B shows another example embodiment of the electromechanical system according to the invention. The embodiment is a further development of the embodiments which are shown in FIGS. 1A, 1B and 6A. The comparator 24" is designed as a Schmitt-Trigger comparator. The comparator 24" comprises the first input terminal 80 which is connected to the circuit node 60 via the second terminal 42.

The Schmitt-Trigger comparator 24" converts the feedback signal S4 into the digital current signal S3. The Schmitt trigger comparator 24" can have a value from an interval between 0.7 V and 1.7 V as the comparator threshold voltage. A hysteresis region, which has the comparator threshold voltage as the center point, can have a width of 0.6 V. Thus, the width of the hysteresis region is the difference between the turn-on level and the turn-off level.

The phase-locked loop 1 additionally comprises the voltage source 81 of FIG. 6A which couples a second input terminal of the comparator 24" to the reference potential terminal 8. The voltage source 81 provides the center point to the Schmitt-Trigger comparator 24".

The comparator 24" in the form of a Schmitt-Trigger can also be implemented in the phase-locked loop of FIGS. 1A and 1B as well as in the current measurement and comparator circuit 73, 73' of FIGS. 5A and 5B.

We claim:

1. A phase-locked loop for controlling an electromechanical component, comprising:
    a digitally controlled oscillator with an output, at which an oscillator signal can be picked up and which can be coupled to a first terminal of the electromechanical component;
    a phase comparator with
        a first input, which is coupled to the output of the digitally controlled oscillator, and
        a second input, which is coupled via a comparator to the first terminal or a second terminal of the electromechanical component for feeding a current signal;
    the comparator, which compares a signal that can be picked up at the first or the second terminal of the electromechanical component or a signal derived from this signal with a comparator threshold; and
    a digital loop filter, which is connected between the phase comparator and the digitally controlled oscillator.

2. The phase-locked loop according to claim 1, wherein the phase comparator is provided, at an output, a digital phase signal, which depends on a phase difference between a first signal at the first input of the phase comparator and the current signal at the second input of the phase comparator.

3. The phase-locked loop according to claim 1, comprising a first register, which is coupled to the digitally controlled oscillator and which is designed for providing a programming value for the frequency of the oscillator signal.

4. The phase-locked loop according to claim 1, comprising a second register, which is coupled to the digitally controlled oscillator and which is designed for storing a value of the frequency of the oscillator signal during an operating phase.

5. The phase-locked loop according to claim 4, comprising a control device, which is coupled to the digitally controlled oscillator and the phase detector and which provides different programming values for the frequency of the oscillator signal during a measurement phase and also to determine a characteristic frequency as a function of the digital phase signal.

6. An electromechanical system, comprising a phase-locked loop according to claim 1, and an arrangement, which comprises the electromechanical component and which has a frequency-dependent impedance with at least one resonant frequency.

7. The electromechanical system according to claim 6, wherein the electromechanical component comprises an actuator.

8. The electromechanical system according to claim 7, wherein the actuator is constructed as a piezoelectric component.

9. The electromechanical system according to claim 7, wherein the actuator is constructed as an oscillating crystal or as a piezo-ceramic.

10. The electromechanical system according to claim 7, wherein the actuator is coupled via an inductive component to the output of the digitally controlled oscillator.

11. The electromechanical system according to claim 7, wherein the actuator is coupled via a resistive component with a reference voltage terminal, and a circuit node between the resistive component and the actuator is coupled to the second input of the phase comparator.

12. A method for operating an electromechanical system, comprising a phase-locked loop and an oscillatory arrangement, comprising the steps of:
- programming of a digitally controlled oscillator of the phase-locked loop with a programming value;
- providing an oscillator signal through the digitally controlled oscillator;
- exciting the oscillatory arrangement with the oscillator signal;
- comparing a signal dependent on a current flowing through the oscillatory arrangement with a comparator threshold and providing a digital current signal as a function of the comparison result;
- performing a phase comparison of the oscillator signal with the digital current signal; and
- tracking the oscillator signal as a function of the phase comparison.

13. The method according to claim 12, for setting the electromechanical system in a measurement phase, comprising:
- programming the digitally controlled oscillator to a first frequency value and providing a first oscillator signal;
- performing a first phase comparison of the first oscillator signal and the current signal that can be picked up and providing a first phase comparison value as a function of the first phase comparison;
- programming the digitally controlled oscillator to at least one second frequency value and providing a second oscillator signal;
- performing at least one second phase comparison and providing at least one second phase comparison value as a function of at least one second phase comparison; and
- providing a characteristic frequency of the arrangement as a function of the first and the one or more second frequency values as well as the first and the one or more second phase comparison values.

* * * * *